(12) United States Patent
Chun et al.

(10) Patent No.: US 7,199,632 B2
(45) Date of Patent: Apr. 3, 2007

(54) DUTY CYCLE CORRECTION CIRCUIT FOR USE IN A SEMICONDUCTOR DEVICE

(75) Inventors: Byung-Kwan Chun, Seoul (KR); Kee-Won Kwon, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 24 days.

(21) Appl. No.: 11/147,629

(22) Filed: Jun. 8, 2005

(65) Prior Publication Data

US 2005/0285649 A1 Dec. 29, 2005

(30) Foreign Application Priority Data

Jun. 23, 2004 (KR) .................... 10-2004-0046975

(51) Int. Cl.
*H03K 3/017* (2006.01)
(52) U.S. Cl. ..................... 327/172; 327/175
(58) Field of Classification Search .................. 327/37, 327/165, 170, 172–175; 331/40, 177 R; 375/238
See application file for complete search history.

(56) References Cited

U.S. PATENT DOCUMENTS

| 5,477,180 | A | 12/1995 | Chen | 327/175 |
|---|---|---|---|---|
| 6,320,438 | B1 * | 11/2001 | Arcus | 327/175 |
| 6,680,637 | B2 * | 1/2004 | Seo | 327/175 |
| 2002/0079939 | A1 | 6/2002 | Nair et al. | 327/175 |

* cited by examiner

*Primary Examiner*—Linh My Nguyen
(74) *Attorney, Agent, or Firm*—F. Chau & Associates, LLC

(57) ABSTRACT

A duty cycle correction circuit for use in a semiconductor device, which synchronizes with an external clock and corrects a duty cycle, is provided. The duty cycle correction circuit includes a modulator of an inverter structure having at least one or more transistors. The modulator receives a control signal through a source terminal and a bulk of any one of the transistors and corrects a duty cycle in response to an external clock signal. The duty cycle correction circuit also includes a driver that converts an output signal of the modulator into a full swing level and outputs the converted output signal of the modulator, and a feedback loop that generates the control signal in response to an output signal of the driver.

15 Claims, 6 Drawing Sheets

DUTY CYCLE CORRECTION CIRCUIT FOR USE IN A SEMICONDUCTOR DEVICE

TECHNICAL FIELD

The present invention relates to a semiconductor device, and more particularly, to a duty cycle correction circuit for correcting a duty cycle of an external clock signal.

DISCUSSION OF THE RELATED ART

A duty cycle of a clock signal indicates a pulse width rate for a pulse cycle of the clock signal. In an application employing a digital clock it is important to correctly adjust a duty cycle of the clock signal. For example, if the duty cycle of a clock signal applied to a synchronous semiconductor memory device is not precisely controlled, the output data of the memory device may be distorted because it is synchronized with the clock signal.

Generally, the output data in a synchronous semiconductor memory device is uniform so that precise data transmission/reception can be obtained. In order to obtain such precise data transmission/reception, a system having a 50% duty cycle and the same frequency as the transmission frequency of data is used. The 50% duty cycle indicates that a high level part and a low level part of a clock signal are equal.

When a clock signal having a duty cycle that is not 50% is inputted to a synchronous semiconductor memory device, a duty cycle correction circuit is used to convert the clock signal into a clock signal having a duty cycle of 50%.

A prior art duty cycle correction circuit is disclosed in U.S. Pat. No. 6,320,438. An example of the duty cycle correction circuit of U.S. Pat. No. 6,320,438 is shown in FIG. 1.

Referring to FIG. 1, the duty cycle correction circuit includes a modulator 56 having PMOS transistors 12 and 14 and NMOS transistors 16 and 18 connected in series, a detector having a driver 33, a resistor 21 and a capacitor 22, and a loop compensator having an error amplifier 30 and an output capacitor 24.

The transistors 14 and 16 of the modulator 56 receive a clock signal CLK IN outputted from an oscillator (not shown) through a common gate, and output an input signal DRIVER IN of the driver 33 through a common drain. The transistors 14 and 16 are not directly connected with a power source voltage and a ground. Instead, the transistors 14 and 16 are connected with the power source voltage and the ground through the transistors 12 and 18 to limit a current flowing in the transistors 14 and 16. The transistors 12 and 18 receive a control signal CTL through each gate thereof.

The driver 33 increases a slew rate of the signal DRIVER IN output from the modulator 56 to enhance the DRIVER IN signal and then outputs a desired signal DRIVER OUT.

The detector and the loop compensator form a feedback loop. The detector outputs a mean voltage of the output signal DRIVER OUT of the driver 33, and the loop compensator amplifies a difference between an output signal DET OUT of the detector and a reference voltage VDD/2, thus controlling a control signal CTL. The control signal CTL is again inputted to the modulator 56 and the above-mentioned procedures are repeated until the output signal DRIVER OUT of the driver 33 has a duty cycle of 50%.

FIG. 2 is a graph illustrating an output signal of the modulator 56 shown in FIG. 1, in which a transverse axis designates a time T and a longitudinal axis denotes a voltage V.

As shown in FIG. 2, when a power source voltage of 1.8V is applied, an output signal DRIVER IN of the modulator 56 has a low slew rate and a pointed shape. Such an output signal results from a duty cycle correction circuit having a stack structure with a control signal and a clock signal applied to a gate of a transistor thereof. Hence, the modulator 56 has a low slew rate and it is sensitive to manufacturing processes, applied voltages and varying temperatures. Further, the modulator 56 has a long delay time and does not operate at high frequencies.

SUMMARY OF THE INVENTION

Exemplary embodiments of the invention provide a duty cycle correction circuit for use in a semiconductor device, which has a high slew rate and high speed and which is capable of operating at high frequency with high stability.

According to an aspect of the invention, a duty cycle correction circuit for use in a semiconductor device, which synchronizes with an external clock and corrects a duty cycle, includes a modulator of an inverter structure having at least one or more transistors, the modulator for receiving a control signal through one source terminal and a bulk of any one of the transistors and for correcting a duty cycle in response to an external clock signal; a driver for converting an output signal of the modulator into a full swing level and for outputting the converted output signal of the modulator; and a feedback loop for generating the control signal in response to an output signal of the driver.

The feedback loop includes a detector circuit for integrating an output signal of the driver, a comparator for comparing an output signal of the detector circuit with a reference signal and for outputting its comparison result, and a stabilization circuit for stabilizing an output signal of the comparator and for outputting the control signal.

The modulator may be an inverter circuit in which one PMOS transistor and one NMOS transistor are connected in series and which receive the external clock signal through a common gate. The driver may include a buffer.

The stabilization circuit may include a low pass filter. The stabilization circuit may have a structure such that a source of the NMOS transistor is connected to a ground terminal and the control signal is applied to a source and a bulk of the PMOS transistor. The stabilization circuit may also have a structure such that a power source voltage is applied to the source of the PMOS transistor and the control signal is applied to the source and a bulk of the NMOS transistor.

According to another aspect of the invention, a method for correcting a duty cycle of a semiconductor device synchronized with an external clock signal is provided.

The method comprises: (a) receiving, at a source and a bulk of one of a plurality of transistors of a modulator, a control signal; (b) correcting, at the modulator, a duty cycle in response to the external clock signal; (c) converting, at a driver, an output signal of the modulator into a full swing level; (d) outputting, at the driver, the converted output signal of the modulator; and (e) generating, at a feedback loop circuit, the control signal in response to an output signal of the driver.

Step (e), comprises: (e-1) integrating, at a detector, an output signal of the driver; (e-2) comparing, at a comparator, an output signal of the detector with a reference signal; (e-3) outputting, from the comparator, a comparison result; (e-4) stabilizing, at a stabilizer, an output signal of the comparator; and (e-5) outputting, at the stabilizer, the control signal.

The method further comprises repeating steps (a–e) until a desired duty cycle is obtained. The desired duty cycle is 50%.

BRIEF DESCRIPTION OF THE DRAWINGS

Exemplary embodiments of the invention are described with reference to the accompanying drawings, of which.

DETAILED DESCRIPTION OF EXEMPLARY EMBODIMENTS

Exemplary embodiments of the present invention will be described with reference to FIGS. 3, 4, 5 and 6.

Figure 3:
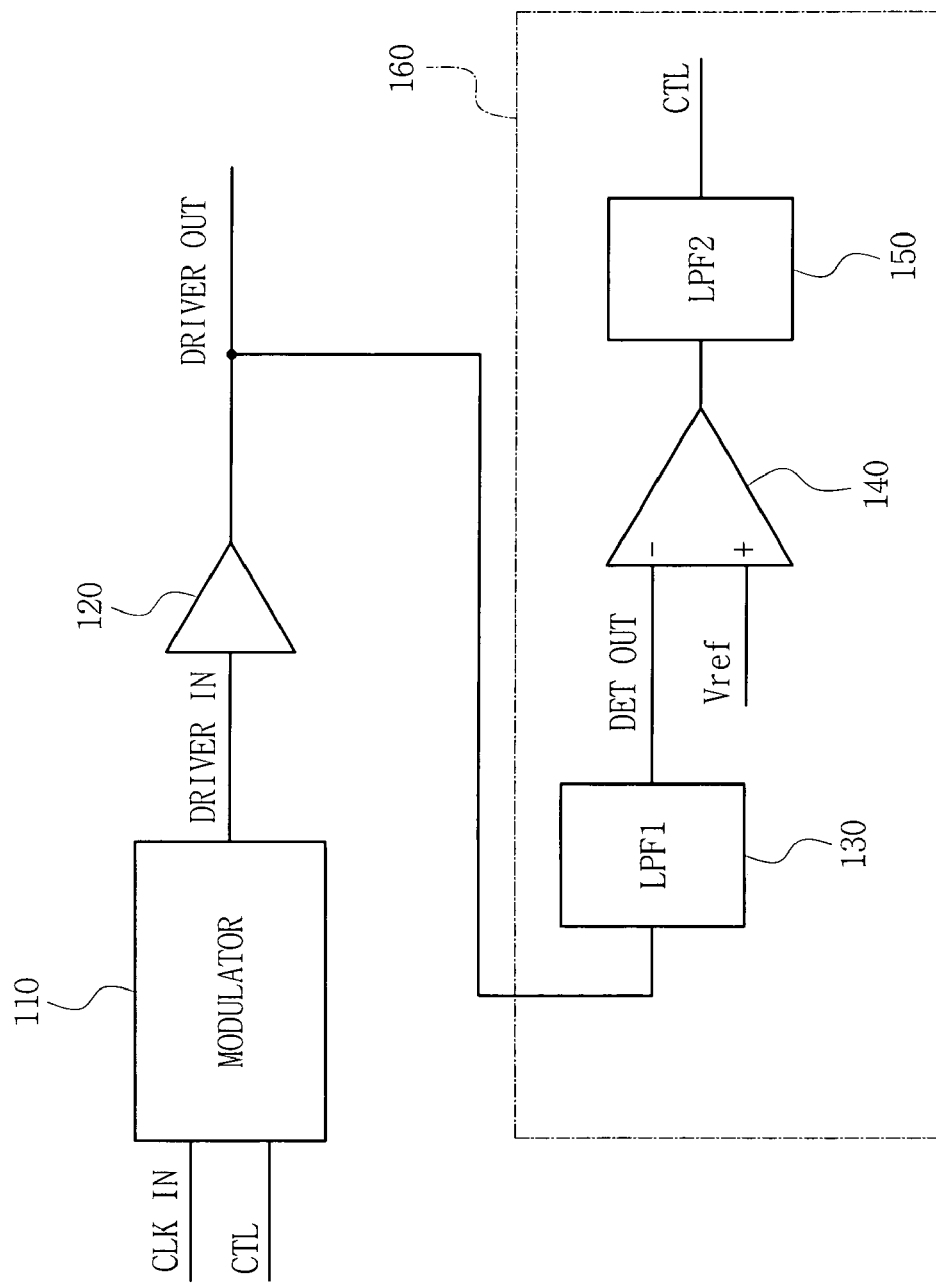
FIG. 3 is a block diagram of duty cycle correction circuit according to an exemplary embodiment of the invention.

FIG. 3 is a block diagram of a duty cycle correction circuit according to an exemplary embodiment of the invention.

Referring to FIG. 3, the duty cycle correction circuit includes a modulator 110, a driver 120 and a feedback loop 160. The feedback loop 160 includes a detector circuit 130, a comparator 140 and a stabilization circuit 150.

The modulator 110 has an inverter structure such that it may include one or more transistors. A control signal CTL is inputted through a source terminal and a bulk of one or more of the transistors, and a duty cycle is corrected in response to an external clock signal CLK IN.

The driver 120 converts an output signal DRIVER IN of the modulator 110 into a full swing level and outputs it as a signal DRIVER OUT. The detector circuit 130 integrates the output signal DRIVER OUT of the driver 120. The comparator 140 compares an output signal DET OUT of the detector circuit 130 with a reference signal Vref, and outputs its comparison result to the stabilization circuit 150. The stabilization circuit 150 stabilizes the output of the comparator 140 and outputs the control signal CTL, which may then be re-input to the modulator 110.

Figure 4:
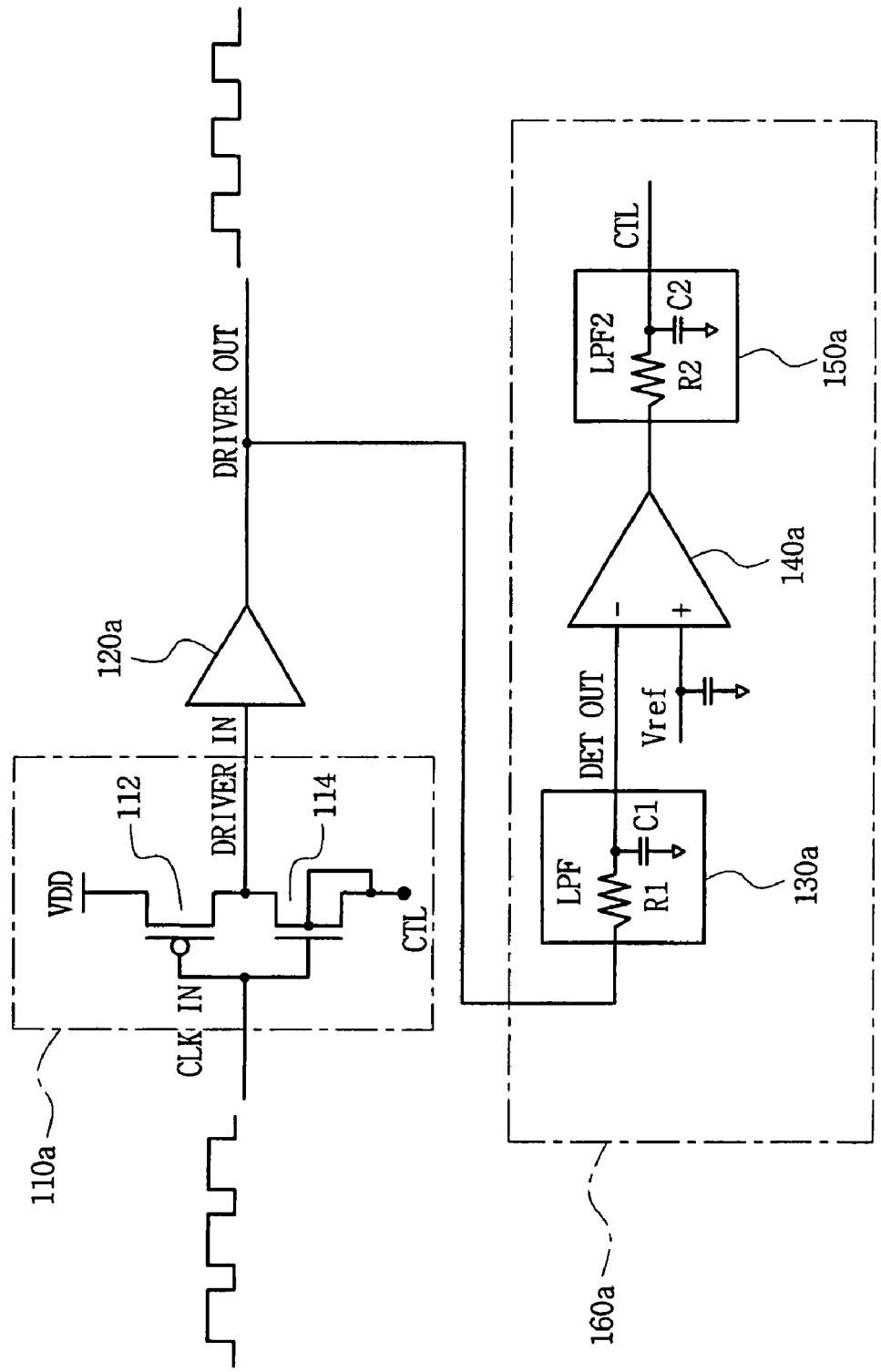
FIG. 4 is an exemplary circuit diagram of the duty cycle correction circuit of FIG. 3.

FIG. 4 is an exemplary circuit diagram of the duty cycle correction circuit of FIG. 3.

With reference to FIG. 4, a modulator 110a is constructed of an inverter circuit in which one PMOS transistor 112 and one NMOS transistor 114 are connected in series and which receive an external clock signal CLK IN through a common gate.

A power source voltage VDD is applied to a source of the PMOS transistor 112, and a control signal CTL is applied to a source and a bulk of the NMOS transistor 114.

When an external clock signal CLK IN is applied from an oscillator, current is limited by the PMOS transistor 112 and the NMOS transistor 114 that receives the control signal CTL through its source, and an output signal DRIVER IN having a high slew rate is outputted through a common drain of the transistors 112 and 114. The external clock signal CLK IN is mostly applied as a clock signal having a duty cycle under 50%. The control signal CTL is adjusted using a feedback loop 160a that is constructed of a detector circuit 130a, a comparator 140a and a stabilization circuit 150a, and is applied to the modulator 110a.

A driver 120a, which is connected to the modulator 110a, may include a buffer for buffering the output signal DRIVER IN of the modulator 110a and for converting the output signal DRIVER IN into a full swing level.

An output signal DRIVER OUT of the driver 120a becomes an input of the feedback loop 160a, and is used to adjust the control signal CTL. Also, the output signal DRIVER OUT of the driver 120a outputted by inputting a precisely adjusted control signal CTL to the modulator 110a has a duty cycle of 50%, thus a desired signal can be obtained.

The detector circuit 130a may include a low pass filter (LPF) type circuit for receiving the output signal DRIVER OUT of the driver 120a. The LPF circuit constituting the detector circuit 130a is constructed of a resistor R1 and a capacitor C1, and integrates the output signal DRIVER OUT of the driver 120a and outputs a mean voltage signal DET OUT.

The comparator 140a may have an error amplifier as a differential amplifier for amplifying a voltage difference between a non-inverting input terminal (+) and an inverting input terminal (−). A reference voltage Vref is supplied to the inverting terminal (−) of the comparator 140a, and when a duty cycle of 50% is required, a voltage a little lower than a half VDD/2 of the power source voltage is supplied. The reference voltage Vref may be supplied by a voltage divider or a reference generator. If the output signal DET OUT of the detector circuit 130a has a 50% duty cycle, an output of the comparator 140a is not changed, but if the output signal DET OUT of the detector circuit 130a does not have a 50% duty cycle, an output of the comparator 140a is changed to adjust the control signal CTL.

The stabilization circuit 150a is provided to prevent a bounce effect of the output signal from the comparator 140a, and includes a low pass filter LPF2. The low pass filter LPF2 of the stabilization circuit 150a is constructed of a resistor R2 and a capacitor C2, stabilizes an output signal of the comparator 140a and outputs the output signal of the comparator 140a so that the output signal is again inputted as the control signal CTL to the modulator 110a.

These procedures continue until the output signal DRIVER OUT of the duty cycle correction circuit has a duty cycle of 50%.

Figure 5:
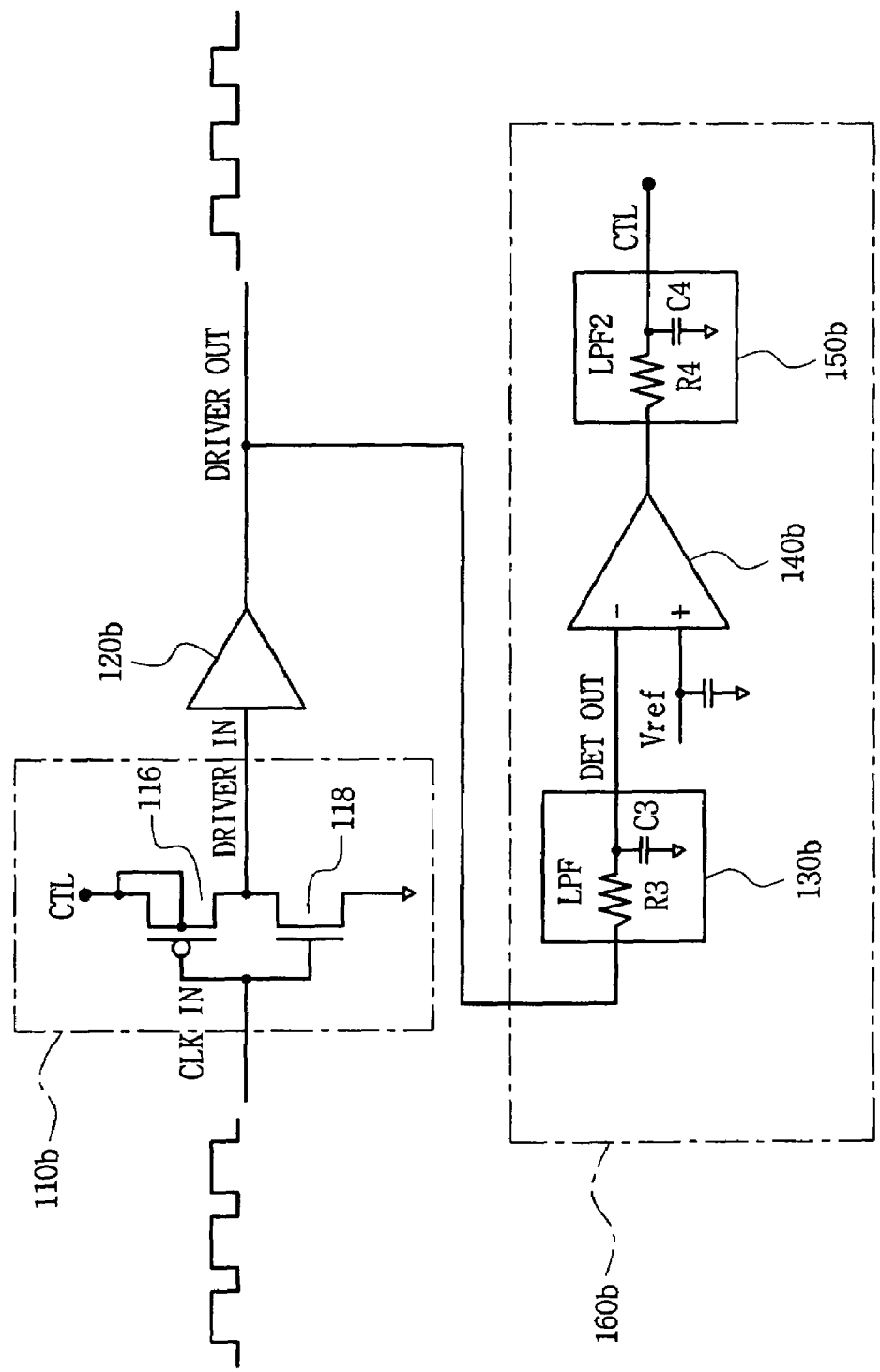
FIG. 5 is another exemplary circuit diagram of the duty cycle correction circuit of FIG. 3.

FIG. 5 is another exemplary circuit diagram of the duty cycle correction circuit of FIG. 3.

With reference to FIG. 5, a modulator 110b is constructed of an inverter circuit in which one PMOS transistor 116 and one NMOS transistor 118 are connected in series and which receive an external clock signal CLK IN through a common gate.

Contrary to FIG. 4, FIG. 5 illustrates a structure in which a control signal CTL is applied to a source and a bulk of the PMOS transistor 116 and a source of the NMOS transistor 118 is connected to a ground.

When an external clock signal CLK IN is applied from an oscillator, current is limited by the NMOS transistor 118 and the PMOS transistor 116 that receives the control signal CTL through its source, and an output signal DRIVER IN having a high slew rate is outputted through a common drain of the transistors 116 and 118. The external clock signal CLK IN is mostly applied as a clock signal having a duty cycle under 50%. The control signal CTL is adjusted using a feedback loop 160b that is constructed of a detector circuit 130b, a comparator 140b and a stabilization circuit 150b, and is applied to the modulator 110b.

A driver 120b, which is connected to the modulator 110b, may include a buffer for buffering an output signal DRIVER IN of the modulator 110b and for converting the output signal DRIVER IN into a full swing level.

An output signal DRIVER OUT of the driver 120b becomes an input of the feedback loop 160b, and is used to adjust the control signal CTL. Also, the output signal DRIVER OUT of the driver 120b outputted by inputting a precisely adjusted control signal CTL to the modulator 110b has a duty cycle of 50%, thus a desired signal can be obtained.

The detector circuit 130b may include an LPF type circuit for receiving the output signal DRIVER OUT of the driver 120b. The LPF circuit constituting the detector circuit 130b is constructed of a resistor R3 and a capacitor C3, and integrates the output signal DRIVER OUT of the driver 120b and outputs a mean voltage signal DET OUT.

The comparator 140b may have an error amplifier as a differential amplifier for amplifying a voltage difference between a non-inverting input terminal (+) and an inverting input terminal (−). A reference voltage Vref is supplied to the inverting terminal (−) of the comparator 140b, and when a duty cycle of 50% is required, a voltage a little higher than a half VDD/2 of the power source voltage is supplied. The reference voltage Vref may be supplied by a voltage divider or a reference generator. If the output signal DET OUT of the detector circuit 130b has a 50% duty cycle, an output of the comparator 140b is not changed, but if the output signal DET OUT of the detector circuit 130b does not have a 50% duty cycle, an output signal of the comparator 140b is changed to adjust the control signal CTL.

The stabilization circuit 150b is provided to prevent a bounce effect of the output signal from the comparator 140b, and includes a low pass filter LPF2. The low pass filter LPF2 of the stabilization circuit 150b is constructed of a resistor R4 and a capacitor C4, stabilizes an output signal of the comparator 140b and outputs the output signal of the comparator 140b so that the output signal is again inputted as the control signal CTL to the modulator 110b.

These procedures continue until the output signal DRIVER OUT of the duty cycle correction circuit has a duty cycle of 50%.

Figure 6:
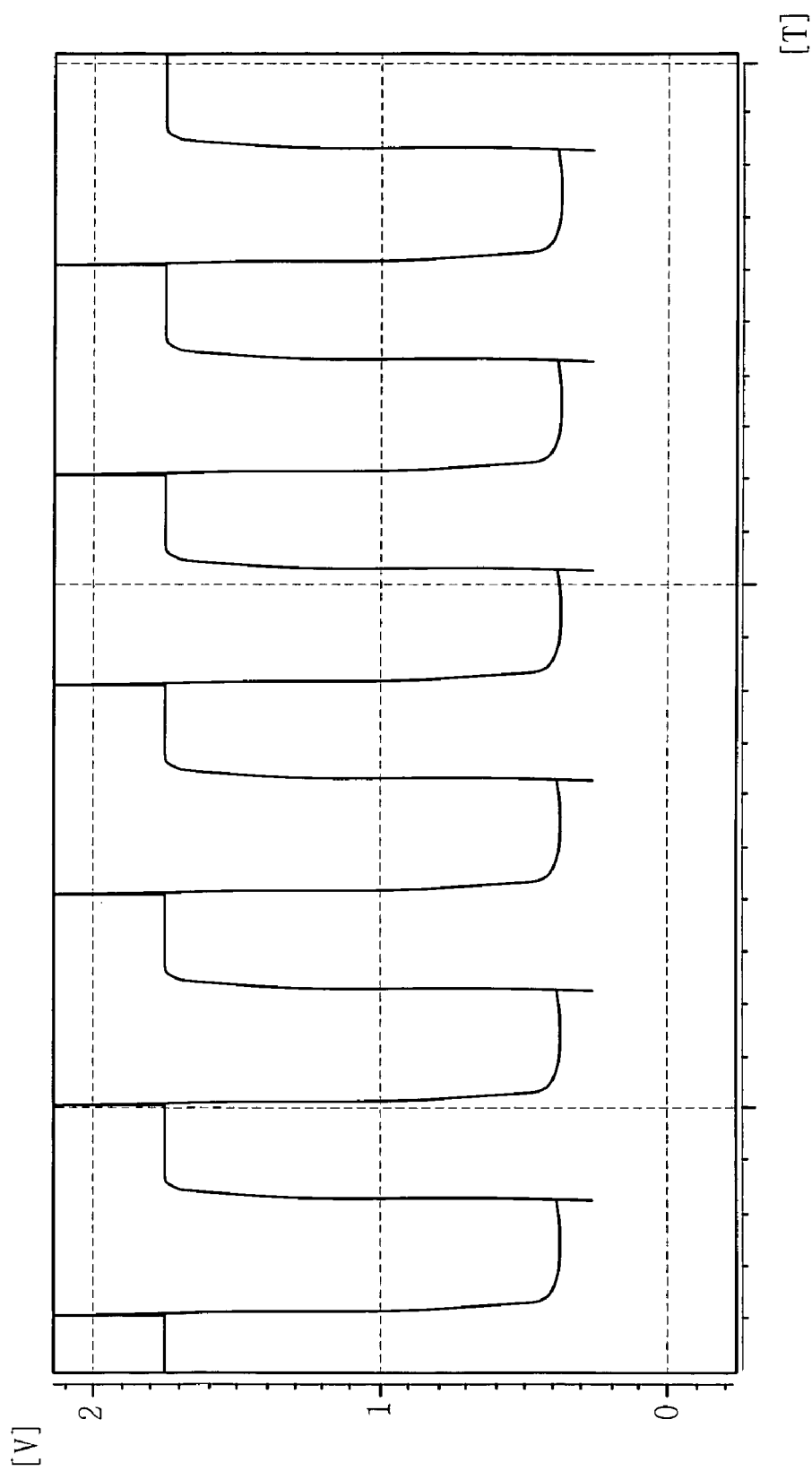
FIG. 6 is a graph illustrating an output signal of a modulator shown in FIG. 4.

FIG. 6 is a graph illustrating a waveform of the output signal DRIVER IN of the modulator 110a as shown in FIG. 4, in which a transverse axis designates a time T and a longitudinal axis denotes a voltage V.

Figure 1:
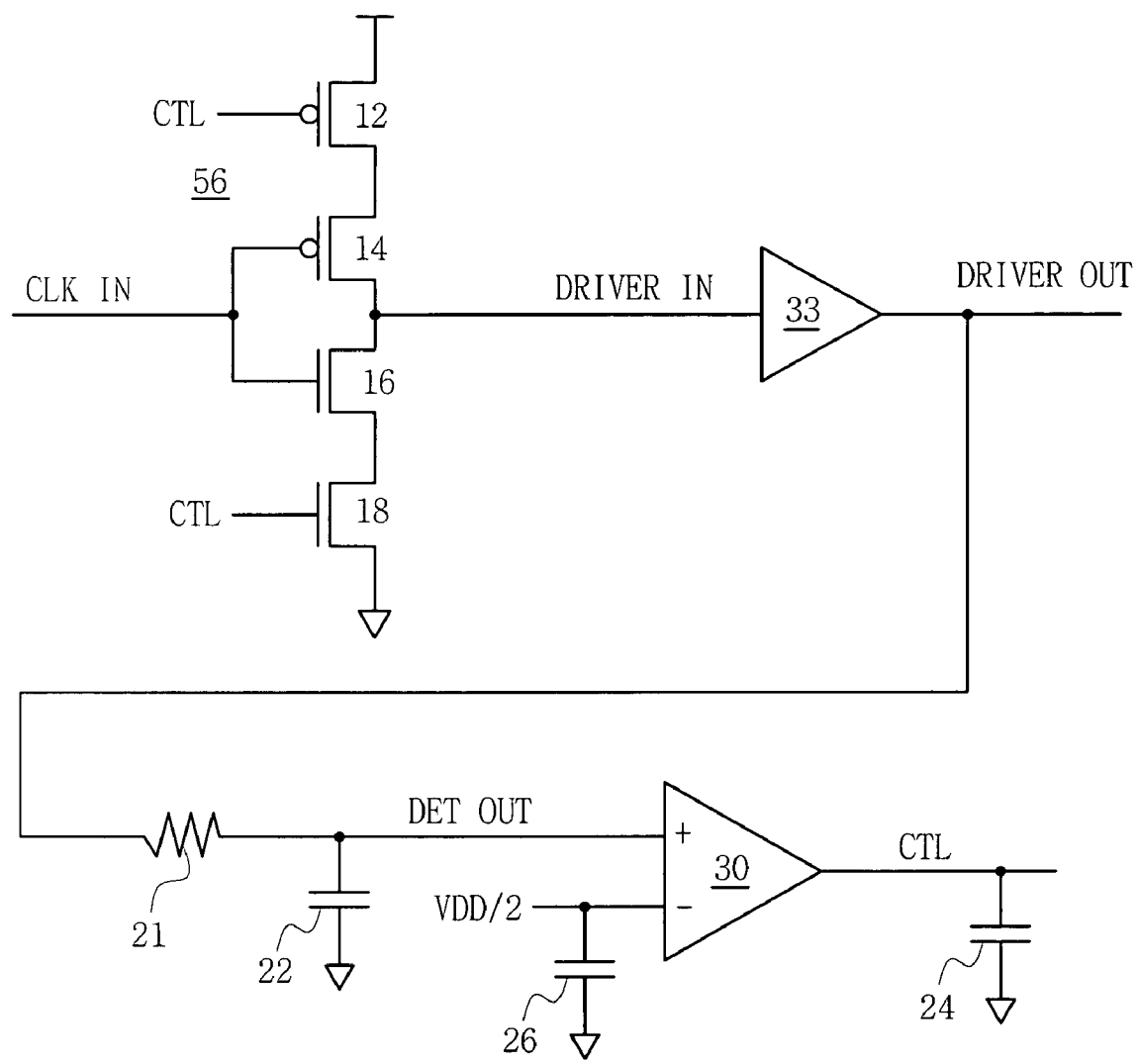
FIG. 1 is a conventional duty cycle correction circuit.
Figure 2:
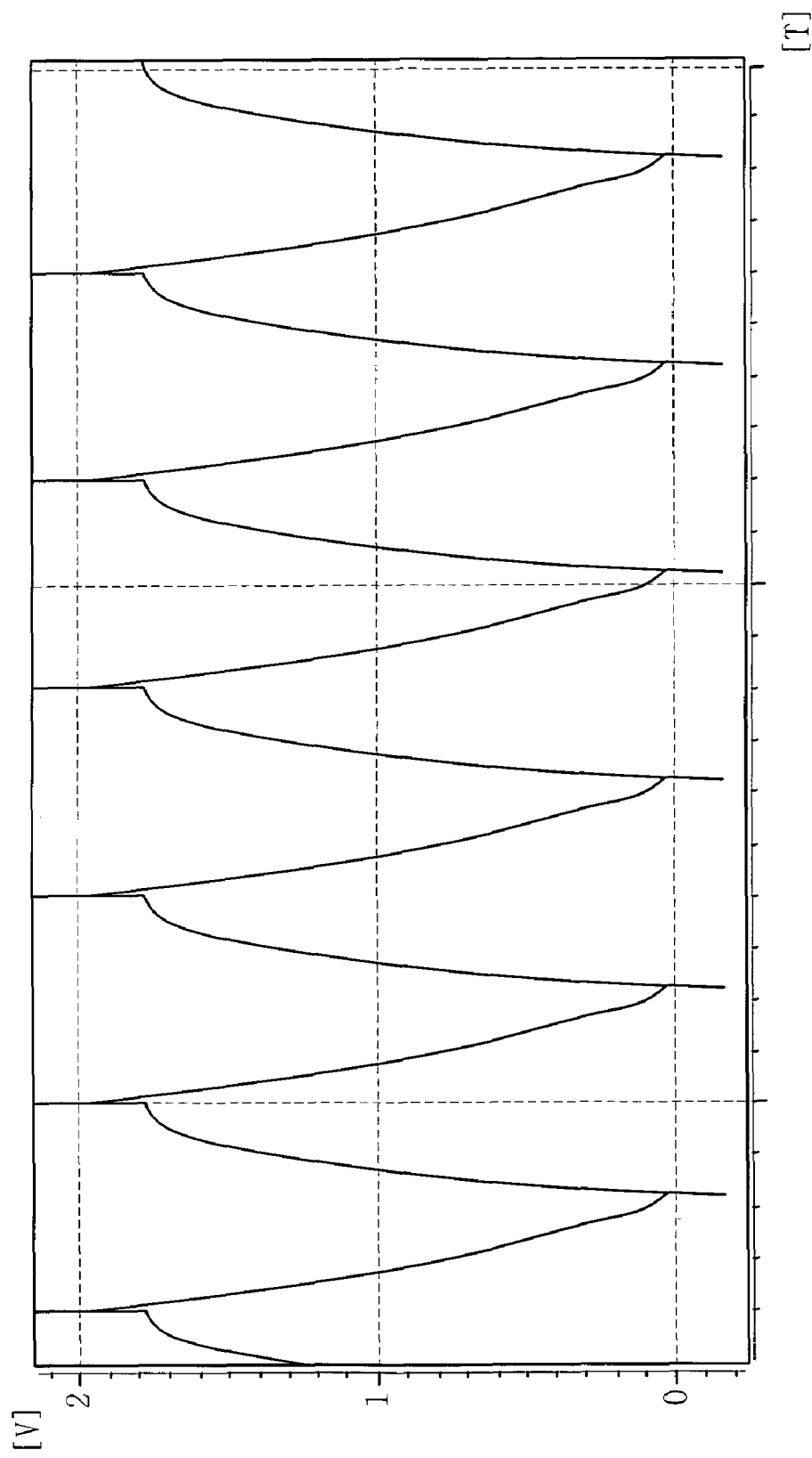
FIG. 2 is a graph illustrating an output signal of a modulator shown in FIG. 1.

As shown in FIG. 6, the output signal DRIVER IN of the modulator 110a is different than the conventional waveform of FIG. 2. In particular, FIG. 6 illustrates a waveform when a power source voltage Vdd is 1.8V. The waveform has an enhanced slew rate as compared with the conventional case. Thus, this waveform is more approximate to a rectangular wave than the conventional waveform.

As described above, in a modulator of a duty cycle correction circuit according to an exemplary embodiment of the invention, a control signal is applied to a source and a bulk of a transistor, thereby a slew rate of its output signal is enhanced and its speed is increased. In addition, the duty cycle correction circuit according to an exemplary embodiment of the invention is capable of performing highly stable operations at high frequencies.

While the present invention has been particularly shown and described with reference to exemplary embodiments thereof, it will be understood by those skilled in the art that various changes in form and details may be made therein without departing from the spirit and scope of the present invention as defined by the appended claims. For example, an internal configuration of the circuits disclosed herein may be changed, or internal devices of the circuits may be replaced with other equivalent devices. Accordingly, these and other changes and modifications are seen to be within the spirit and scope of the invention as defined by the appended claims.

What is claimed is:

1. A duty cycle correction circuit for use in a semiconductor device, the circuit comprising:
    a modulator having at least one or more transistors, the modulator for receiving a control signal through a source terminal and a bulk of one of the transistors and for correcting a duty cycle in response to an external clock signal;
    a driver for converting an output signal of the modulator into a full swing level and for outputting the converted output signal of the modulator; and
    a feedback loop circuit for generating the control signal in response to an output signal of the driver.

2. The circuit of claim 1, wherein the feedback loop circuit comprises:
    a detector for integrating an output signal of the driver;
    a comparator for comparing an output signal of the detector with a ref rence signal and for outputting a comparison result; and
    a stabilizer for stabilizing an output signal of the comparator and for outputting the control signal.

3. The circuit of claim 2, wherein the modulator is an inverter circuit in which the transistors include one PMOS transistor and one NMOS transistor connected in series and which receive the external clock signal through a common gate.

4. The circuit of claim 3, wherein the detector has a low pass filter.

5. The circuit of claim 4, wherein the comparator includes an error amplifier.

6. The circuit of claim 5, wherein the stabilizer includes a low pass filter.

7. The circuit of claim 6, wherein a source of the NMOS transistor is connected to a ground terminal and the control signal is applied to a source and a bulk of the PMOS transistor.

8. The circuit of claim 6, wherein he PMOS transistor receives an applied power source voltage through its source and the control signal is applied to a source and a bulk of the NMOS transistor.

9. The circuit of claim 3, wherein the driver includes a buffer.

10. A method for correcting a duty cycle of a semiconductor device synchronized with an external clock signal, the method comprising:
    (a) receiving, at a source and a bulk of one of a plurality of transistors of a modulator, a control signal;
    (b) correcting, at the modulator, a duty cycle in response to the external clock signal;
    (c) converting, at a driver, an output signal of the modulator into a fill swing level;
    (d) outputting, at the driver, the converted output signal of the modulator; and
    (e) generating, at a feedback loop circuit, the control signal in response to an output signal of the driver.

11. The method of claim 10, wherein the step (e), comprises;
    (e-1) integrating, at a detector, an output signal of the driver;

(e-2) comparing, at a comparator, an output signal of the detector with a reference signal;
(e-3) outputting, from the comparator, a comparison result;
(e-4) stabilizing, at a stabilizer, an output signal of the comparator; and
(e-5) outputting, at the stabilizer, the control signal.

12. The method of claim 10, further comprising:
repeating steps (a–e) until a desired duty cycle is obtained.

13. The method of claim 12, wherein the desired duty cycle is 50%.

14. A duty cycle correction circuit for use in a semiconductor device, the circuit comprising:
a modulator having at least one or more transistors, the modulator for receiving a control signal through a source terminal and a bulk of one of the transistors arid for correcting a duty cycle in response to an external clock signal;
a driver for converting an output signal of the modulator into a full swing level and for outputting the converted output signal of the modulator; and
a feedback loop circuit for generating the control signal in response to an output signal of the driver;
wherein the transistors include one PMOS transistor and one NMOS transistor connected in series and which receive the external clock signal through a common gate;
wherein a source of the NMOS transistor is connected to a ground terminal and the control signal is applied to a source and a bulk of the PMOS transistor.

15. A duty cycle correction circuit for use in a semiconductor device, the circuit comprising:
a modulator having at least one or more transistors, the modulator for receiving a control signal through a source terminal and a bulk of one of the transistors and for correcting a duty cycle in response to an external clock signal;
a driver for converting an output signal of the modulator into a full swing level and for outputting the converted output signal of the modulator; and
a feedback loop circuit for generating the control signal in response to an output signal of the driver;
wherein the transistors include one PMOS transistor and one NMOS transistor connected in series and which receive the external clock signal through a common gate;
wherein the PMOS transistor receives a power source voltage through its source and the control signal is applied to a source and a bulk of the NMOS transistor.

* * * * *